United States Patent

Ohnuma et al.

[11] Patent Number: 6,156,628
[45] Date of Patent: Dec. 5, 2000

[54] SEMICONDUCTOR DEVICE AND METHOD OF MANUFACTURING THE SAME

[75] Inventors: Hideto Ohnuma, Kanagawa; Tosiyuki Agui, deceased, late of Kanagawa, by Kouzi Agui, administrator; Akiko Shiba, Kanagawa, all of Japan

[73] Assignee: Semiconductor Energy Laboratory Co., Ltd., Kanagawa-ken, Japan

[21] Appl. No.: 09/118,009

[22] Filed: Jul. 17, 1998

[30] Foreign Application Priority Data

Jul. 22, 1997 [JP] Japan .................................. 9-212465

[51] Int. Cl.⁷ .................................................. H01L 21/20
[52] U.S. Cl. ........................ 438/486; 438/149; 438/151; 438/153; 438/154; 438/162; 438/166; 438/471; 438/473
[58] Field of Search .................................... 438/149, 151, 438/153, 154, 162, 166, 471, 473, 486

[56] References Cited

U.S. PATENT DOCUMENTS

| | | | |
|---|---|---|---|
| 5,543,352 | 8/1996 | Ohtani et al. | 437/101 |
| 5,585,291 | 12/1996 | Ohtani et al. | 437/40 |
| 5,814,835 | 9/1998 | Makita et al. | 257/64 |
| 5,837,569 | 10/1999 | Manika et al. | 438/166 |
| 5,851,860 | 12/1998 | Makita et al. | 438/166 |
| 5,854,096 | 12/1998 | Ohtani et al. | 438/166 |
| 5,893,730 | 4/1999 | Yamazaki et al. | 438/166 |
| 5,897,347 | 4/1999 | Yamazaki et al. | 438/166 |
| 5,904,770 | 5/1999 | Ohtani et al. | 177/103 |
| 5,923,962 | 7/1999 | Ohtani et al. | 438/150 |
| 5,961,743 | 10/1999 | Yamazaki et al. | 136/258 |

*Primary Examiner*—David Nelms
*Assistant Examiner*—Quoc Hoang
*Attorney, Agent, or Firm*—Eric J. Robinson; Nixon Peabody LLP

[57] ABSTRACT

In a method of manufacturing a semiconductor device, nickel elements 404 is held on a surface of an amorphous silicon film 403 in a contact manner, and then transformed into a crystalline silicon film 405 through a heat treatment. Thereafter a mask 406 is formed to conduct doping with phosphorus, In this process, a region 407 is doped with phosphorus. Then, the region 407 which has been doped with phosphorus is activated by the irradiation of a laser beam or an intense light. Then, a heat treatment is conducted on the layer again to getter nickel in the region 407. Subsequently, the region 407 into which nickel is concentrated is removed so nickel is gettered, to obtain a region 408 having still higher crystallinity.

49 Claims, 10 Drawing Sheets

○ 600 °C 4h
△ LA + 600 °C 4h

○ 600 °C 8h
△ LA + 600 °C 8h

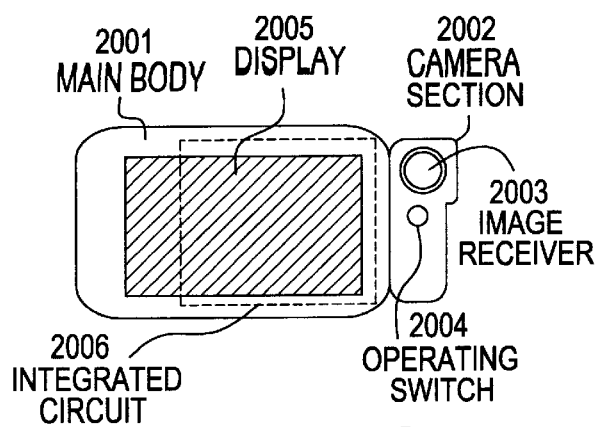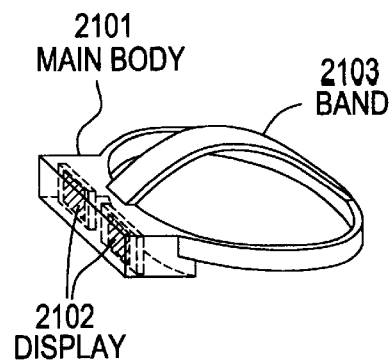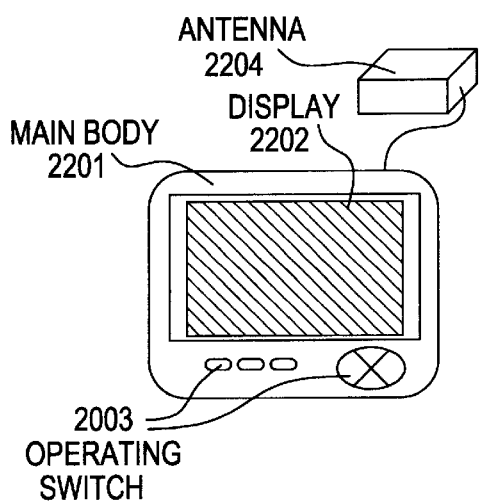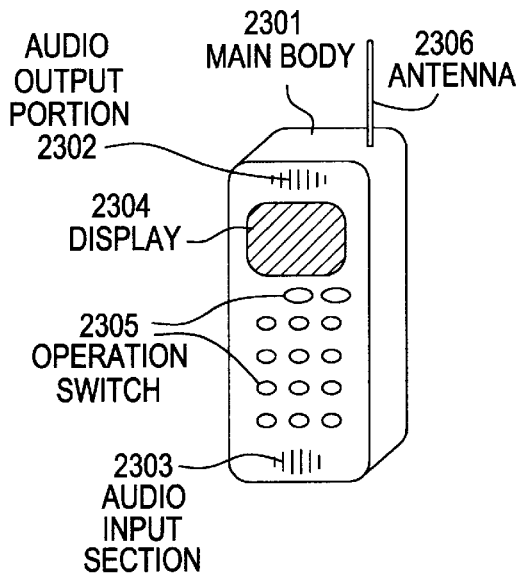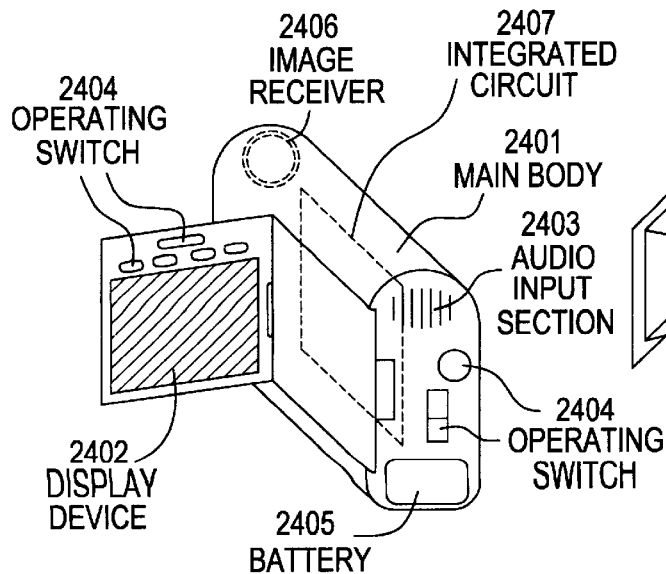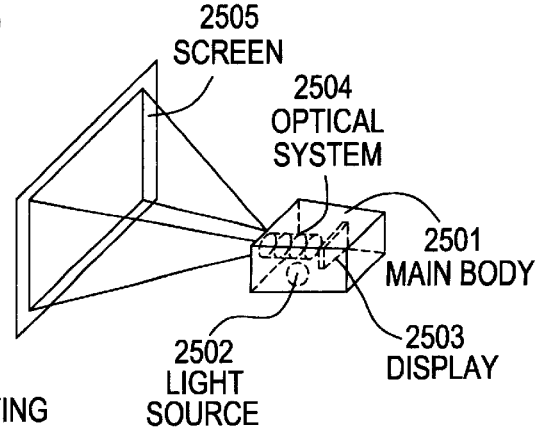

SEMICONDUCTOR DEVICE AND METHOD OF MANUFACTURING THE SAME

BACKGROUND OF THE INVENTION

1. Field of the Invention

The present invention relates to a method of adding crystallization promoting catalyst elements to a semiconductor material partially or entirely consisting of an amorphous component, or a substantially intrinsic polycrystal semiconductor material, subjecting the semiconductor material to an annealing process or the like, to thereby improve the crystallinity of the semiconductor material, and further efficiently moving the crystallization promoting catalyst elements to a region where the semiconductor device is not adversely affected by the crystallization promoting catalyst elements.

2. Description of the Related Art

In recent years, a research on a technique of lowering a temperature during a semiconductor device process has been extensively advanced. The main reason is because the semiconductor device needs to be formed on an insulating substrate made of glass or the like which is inexpensive and rich in processability.

A melting point of glass widely and generally used as the substrate of a semiconductor film is about 600° C., and the temperature of the substrate cannot be made higher than 600° C. Therefore, the semiconductor device must be manufactured at a temperature lower than about 600° C.

In the semiconductor process, there may be required that the amorphous component contained in the semiconductor material or an amorphous semiconductor material is crystallized, or that the crystallinity is improved.

Up to now, thermal annealing has been made to satisfy the above requirements. In the case where silicon is used as the semiconductor material, annealing is conducted at a temperature of 600 to 1100° C. for 0.1 to 48 hours or more hours, to thereby crystallize the amorphous material, to improve the crystallinity and so on. When the thermal annealing is intended to be thus conducted on a semiconductor film formed on a glass substrate, since the crystallinity must be improved at a temperature extremely close to a strain point of the glass substrate, that is, at about 600° C., a very long time is required for crystallization. The temperature of 600° C. is close to the lowest temperature required for the crystallization of silicon, and when the temperature is 500° C. or lower, no crystallization occurs even if annealing is continued for a long period of time.

Therefore, there is required that the conventional crystallizing process is reconsidered from the viewpoint of making the process temperature low. The laser beam irradiation technique is one of techniques that realize a low-temperature process. This is because a laser beam can give a high energy equal to thermal annealing at about 1000° C. restrictively to only a semiconductor film so that the entire substrate does not need to be exposed to a high temperature. The irradiation of a laser beam is mainly made by a method in which a large-energy laser pulse is irradiated onto the semiconductor material using a pulse oscillation laser such as an excimer laser so that the semiconductor material is instantaneously melted and solidified, to thereby crystallize the semiconductor material. The crystallinity of the semiconductor film obtained by crystallization due to the laser of this type is relatively high.

However, the characteristic of a TFT manufactured using a silicon film thus crystallized by the laser is varied by instability of the laser, which requires further review.

Under the above circumstances, the present inventors have devised a method in which nickel which is one of elements that promote the crystallization is added to amorphous Si deposited through the plasma CVD method, and thermal annealing is then conducted on the amorphous Si to make the amorphous Si grow in a solid layer. This method enables the amorphous Si to be changed into a polycrystal Si film under a low-temperature and short-period condition, that is, at 600° C. for 4 hours.

The above method using nickel enables the polycrystal Si film to be formed on the glass substrate without using the laser for a relatively short period of time. However, disappointedly, the characteristic of the polycrystal Si film is not satisfactory in comparison with a film obtained through the laser. Concentrations of nickel are found everywhere in the interior of the film obtained by the above method in which nickel is added to the amorphous Si. When a portion where nickel is concentrated is unexpectedly in a channel region or a high-resistant region (for example, a portion called "offset region") of the TFT, the characteristic is significantly degraded. In particular, an off-state current is remarkably increased.

From the above viewpoints, the present inventors reviewed a method of removing nickel from a film in which nickel is contained, or reviewed a method of removing nickel from at least the channel region and the high-resistant region. Then, the present inventors have paid attention to a phenomenon in which annealing is conducted on a nickel contained film to which phosphorous is selectively added, to thereby allow nickel to be attracted to phosphorus so that nickel is substantially removed from a region other than a region where phosphorus is added, and tried to optimize the condition of the phenomenon. A technique of removably sucking the impurities is generally called "gettering".

The above method is usually that, typically, after phosphorus is added to the film, thermal annealing is conducted at about 600° C. for several hours to ten several hours so that nickel and other impurities are removably attracted to phosphorus. At a temperature of 600° C., this method utilizes a property that nickel is remarkably moved although phosphorus hardly moves in the film.

Although a sufficient effect is obtained even by the above method, a long period of time is required for processing. Also, an area of the region where phosphorus is added is required to increase, thereby leading to a problem that the fining of a circuit is adversely affected by such requirement, or the like. In particular, the gettering technique that imposes restrictions on the fining of the circuit goes against an advance in technique.

SUMMARY OF THE INVENTION

The present invention has been made to eliminate the above problems. The present inventors have found that phosphorus is activated, thereby being capable of significantly saving the processing period of time.

Also, the present inventors have found that an area of the region where phosphorus is added is greatly reduced. The activating was carried out by the laser technique and the RTA (a short-period heat treatment by irradiation of infrared rays) technique, as a result of which both of those techniques were effective.

FIGS. 1A to 1C are graphs showing the results obtained by adding phosphorus in the form of stripes to a silicon film which is crystallized by nickel, and investigating a gettering capacity with a change in a heating period, an area of a region where phosphorus is added (defined by a width S $\mu$m of the stripes in FIGS. 1A to 1C) and an area of a region where no phosphorus is added (defined by a width L μm of the stripes in FIGS. 1A to 1C). In the figures, what are indicated by a mark A are results obtained by activating phosphorus through laser before the heat treatment.

The above investigation was made under the condition where a heating temperature was 600° C., and the dose of phosphorus was $5 \times 10^{14}$ ions/cm². As a result, the area of the region where minimum phosphorus required for the completion of gettering is added (defined by the width S μm of the stripes in FIGS. 1A to 1C) is graphed with a change in the area of the region where no phosphorus is added (defined by the width L μm of the stripes in FIGS. 1A to 1C) and the heating period. FIG. 1A shows the results when the heating period is 4 hours, FIG. 1B shows the results when the heating period is 8 hours, and FIG. 1C shows the results when the heating period is 12 hours.

As is apparent from FIGS. 1A to 1C a method in which a heat treatment is conducted after phosphorus is activated through laser is higher in gettering capacity. In other words, it is clearly found that the film which has been subjected to laser processing can be more shortened in processing period and more reduced in a phosphorus-doped region area.

FIGS. 2A and 2B are photographs visually showing an appearance where nickel is subjected to gettering. When nickel is in a silicon film, portions of the silicon film where nickel is contained have a property that it is liable to be etched by a solution called as "FPM" so as to be pierced for a short period of time. Utilizing such a property, an appearance that nickel is gettered was photographed.

In the figures, numberless black points are portions where nickel exists. FIG. 2A shows a state of the film before gettering, and FIG. 2B shows a state of the film after gettering.

An appearance that nickel disappears from some region is well found from those photographs. The concentration of metal elements in a region which has been completely subjected to gettering was $5 \times 10^{16}$ ATOMS/cm³ or less.

Hereinafter, the reason why the efficiency of gettering is enhanced when phosphorus is activated will be considered. Since phosphorus moves along grain boundaries in a semiconductor film at the time of heating, a large energy is required for the movement. On the other hand, since nickel is moved in clearances between atoms, it can move relatively easily. In this situation, when phosphorus is in an inactive state, it relatively easily reaches the grain boundaries and slightly moves. However, when phosphorus is in an active state, a heat of 1000° C. or higher is required in order to disconnect its bond so that phosphorus moves along the grain boundaries. This is because the grain boundaries are hardened by an energy that allows phosphorus to be activated, and a path of phosphorus is, partially interrupted. Hence, the activation is effective means for fixing phosphorus.

Also, if phosphorus is activated, the gettering capacity is enhanced by its electric force. On the other hand, since upon reception of an energy produced when phosphorus is activated, nickel is diffused into the film as nickel silicide, there comes to a state where the film is liable to be more gettered.

It can be expected from the above consideration it is improper to conduct gettering at a temperature of 1000° C. or higher. A temperature suitable for gettering was about 950° C. at maximum.

Also, although the same effect as that when the simple substance of nickel is used is not obtained, one or plural kinds of catalytic elements selected from Fe, Co, Ru, Rh, Pd, Os, Ir, Pt, Cu and Au can be employed as other crystallization promoting catalytic elements. Also, Ni may be added to those element group and used together with other metal.

Further, although the same effect as that when the simple substance of nickel is used is not obtained, one or plural kinds of catalytic elements selected from Ge, Pb and In can be used as other crystallization promoting catalytic elements.

Compared with the above element group of Ni, Fe, Co, Ru, Rh, Pd, Os, Ir, Pt, Cu and Au, the element group of Ge, Pb and In is slow to the degree of 1/100 in in-film diffusion speed at the same temperature, and therefore gettering must be conducted at a relative high temperature.

As elements that enable the above crystallization promoting catalytic elements to be gettered, there have been known 15-group elements such as N, As, Sb or Bi other than phosphorus. In the present specification, those elements including phosphorus are called "gettering elements". Those elements may be used instead of or together with phosphorus. Otherwise, plural kinds of elements may be used together. However, the use of phosphorus is most effective.

Since phosphorus or the like can be used as n-type dopant, after phosphorus is introduced into the source and drain regions of a TFT having an active layer containing nickel herein, and the source-drain region is then activated by laser or the like, thermal annealing at about 600° C. is conducted on the layer. As a result, there occurs a phenomenon that phosphorus allows nickel to be sucked out from the channel region and the high-resistant region of the TFT, that is, gettering. With this phenomenon, impurities such as nickel can be removed from the channel region or high-resistant region of the TFT. The characteristic of the TFT is hardly adversely affected by nickel so far as nickel is in the source and drain regions.

Although only a TFT of an N channel is manufactured by this method, a TFT of a P channel can be also manufactured with addition of p-type dopant such as phosphorus. Also, in this case, the gettering capacity of phosphorus is not changed. There exists substantially no Ni-Six in the depletion layer of n-i and p-i junctions of the TFT manufactured in the above method.

The present invention has been initially devised for a low-temperature process, but is also effective when the same process is conducted on a semiconductor device formed on a quartz substrate that can be subjected to a higher-temperature process than 600° C., for example, the application of a temperature of 850° C. or higher. The effect is to remove Ni in the film having higher crystallinity which has been obtained by Ni in a relatively short period of time. Also, an area of the region to which gettering elements are added can be reduced more than the conventional one.

From the above viewpoints, the invention is summarized by a technique in which after the gettering elements are sufficiently activated in a semiconductor film, the semiconductor film is heated at a temperature lower than a temperature required for the former activation, to thereby getter impurities in the semiconductor film efficiently.

According to a first aspect of the present invention, there is provided a method of manufacturing a semiconductor device, comprising:

a first step of forming an amorphous semiconductor film containing silicon therein on a substrate having an insulating surface;

a second step of introducing catalytic elements that promote the crystallization of the amorphous semiconductor film into the amorphous semiconductor film;

a third step of crystallizing the amorphous semiconductor film through a heat treatment;

a fourth step of selectively introducing elements that enable the catalytic elements to be gettered into a semiconductor film obtained in the third step;

a fifth step of activating the gettering elements; and a sixth step of gettering the catalytic elements through a heat treatment in a region into which the gettering elements are introduced in the fourth step;

wherein the third and sixth steps are conducted so that a temperature of the substrate does not exceed a strain point temperature of the substrate.

The use of a laser is proper for the activation according to the first aspect of the present invention.

The use of RTA is proper for the activation according to the first aspect of the present invention.

The RTA is means for heating and annealing a region to which an intense light is irradiated. The intense light to be generally used is infrared rays.

The catalytic elements that promote the crystallization according to the first aspect of the present invention may be one or plural kinds of elements selected from Ni, Fe, Co, Ru, Rh, Pd, Os, Ir, Pt, Cu and Au.

The catalytic elements that promote the crystallization according to the first aspect of the present invention may be one or plural kinds of elements selected from Ge, Pb and In.

As elements that can getter the above crystallization promoting catalytic elements, there have been known 15-group elements such as N, As, Sb or Bi other than phosphorus, and any elements exhibit the effects of the present invention.

According to a second aspect of the present invention, there is provided a method of manufacturing a semiconductor device, comprising:

a first step of forming an amorphous semiconductor film containing silicon therein on a substrate having an insulating surface;

a second step of introducing nickel which is a catalytic element that promotes the crystallization of the amorphous semiconductor film into the amorphous semiconductor film;

a third step of crystallizing the amorphous semiconductor film through a heat treatment;

a fourth step of selectively introducing phosphorus which is an element that can getter the catalytic element into the semiconductor film obtained in the third step;

a fifth step of activating phosphorus which is the gettering element; and a sixth step of gettering nickel which is the catalytic element through a heat treatment in a region into which phosphorus which is the gettering element is introduced in the fourth step;

wherein the third and sixth steps are conducted so that a temperature of the substrate does not exceed a strain point temperature of the substrate.

The use of a laser is proper for the activation according to the second aspect of the present invention.

The use of RTA is proper for the activation according to the second aspect of the present invention.

In the fifth step according to the second aspect of the present invention, it is effective that a sheet resistance of the region in which phosphorus is activated is 10 K$\Omega$/□ or less.

In the fifth step according to the second aspect of the present invention, it is more effective that a sheet resistance of the region in which phosphorus is activated is 3 K$\Omega$/□ or less.

In the fourth step according to the second aspect of the present invention, it is very effective that a rate of the area of the region in which phosphorus is added to an area of the region in which nickel is gettered is even in a range of from 0.05 to 0.6.

In the fourth step according to the second aspect of the present invention, it is effective that the rate of the area of the region in which phosphorus is added to the area of the region in which nickel is gettered is even in a range of from 0.1 to 0.5.

In the fourth step according to the second aspect of the present invention, it is effective that the amount of adding phosphorus is in a range of from $1\times10^{13}$ to $1\times10^{16}$ IONS/cm$^2$.

In the fourth step according to the second aspect of the present invention, it is effective that the amount of adding phosphorus is in a range of from $1\times10^{14}$ to $3\times10^{15}$ IONS/cm$^2$.

In the third and sixth steps according to the second aspect of the present invention, it is effective that a thermal annealing temperature is 400 to 850° C.

In the third and sixth steps according to the second aspect of the present invention, it is more effective that the thermal annealing temperature is 500 to 750° C.

In the sixth step according to the second aspect of the present invention, it is effective that the thermal annealing period is 1 minute to 20 hours. In the sixth step according to the second aspect of the present invention, it is more effective that the thermal annealing period is 30 minute to 3 hours.

In the fourth step according to the first or second aspect of the present invention, the present invention is effective when no gettering element is added to a region in which the device is formed.

In the fourth step according to the first or second aspect of the present invention, the present invention is effective when no gettering element is added to both of a channel region and a high-resistant region (offset region) of the device.

Another structure of the present invention is a semiconductor device in which nickel is added to source and drain portions, and there exists substantially no Ni-Six in a depletion layer of the n-i and p-i junctions.

The above and other objects and features of the present invention will be more apparent from the following description taken in conjunction with the accompanying drawings.

BRIEF DESCRIPTION OF THE DRAWINGS

In the drawings:

FIGS. 9A to 9F are diagrams showing examples of various devices using the TFT, respectively.

DETAILED DESCRIPTION OF THE PREFERRED EMBODIMENTS

Now, a description will be given in more detail of preferred embodiments of the present invention with reference to the accompanying drawings.

First Embodiment

This embodiment is directed to a technique in which after crystallization promoting catalytic elements are added to a non-crystalline semiconductor film, and desired crystallinity is then given to the crystalline film by means such as annealing, needless crystallization promoting catalytic elements are removed from a region in which the semiconductor film device is formed.

Hereinafter, a description will be given of an example in which Ni is used for the crystallization promoting catalytic element, silicon is used for the non-crystalline semiconductor film, and a silicon film having crystallinity is formed on a glass substrate. Most of the crystallization promoting catalytic elements are removed from the region in which the silicon film device is formed after or while the crystalline silicon film is formed.

First, in FIGS. 4A to 4E, there is prepared a glass substrate 401 of 12.5 cm square (for example, Corning 1737 glass substrate). Then, a silicon oxide film 402 is formed in thickness of 2000 Å through the plasma CVD method using TEOS as a raw material. It is needless to say that this thickness may be adjusted to a required one. The silicon oxide film 402 functions as an under film that prevents impurities from being diffused into the semiconductor film from the glass substrate side.

Figure 4A:
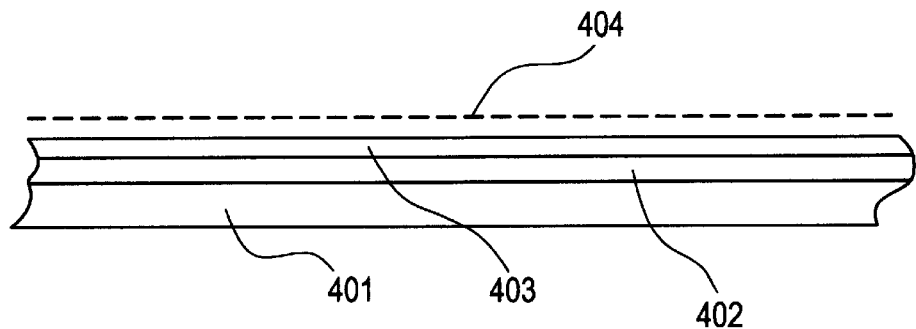
FIGS. 4A to 4E are diagrams showing a process of manufacturing a crystalline silicon film.

Then, an amorphous silicon film 403 is formed through the plasma CVD method. In this example, the plasma CVD method is used, but a low-pressure CVD (LPCVD) method may be used. The thickness of the amorphous silicon film is set to 550 Å. It is needless to say that this thickness may be adjusted to a required one. Then, a UV light is applied onto the surface of the amorphous silicon film, to thereby form a thin oxide film. Further, a liquid-phase Ni acetic acid is coated on the surface of the amorphous silicon film through the spin coating method. The oxide film is formed in order to uniformly coat Ni acetic acid 404 on the film surface. Ni elements function as elements that promote the crystallization when the amorphous silicon film is crystallized (FIG. 4A).

Figure 4B:
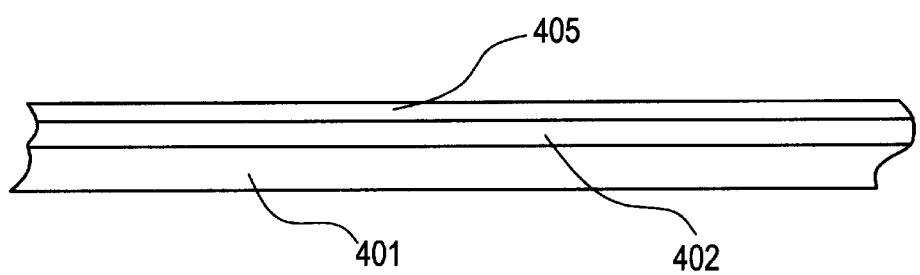
Figure 4C:
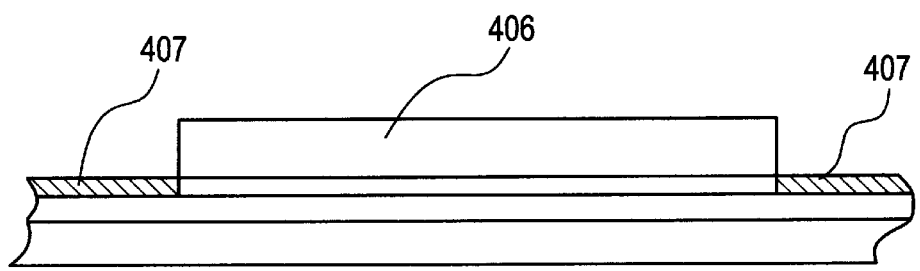
Figure 4D:
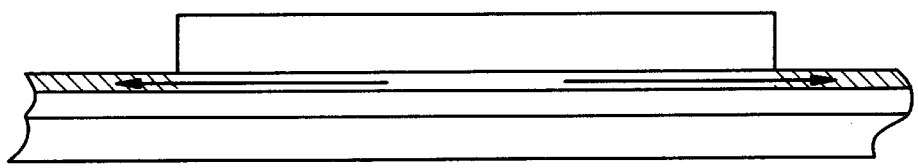
Figure 4E:
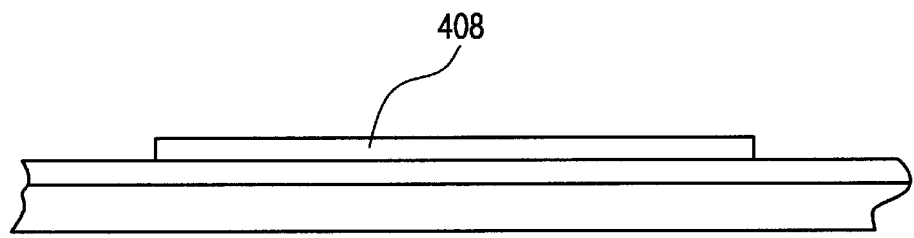

Subsequently, in a nitrogen atmosphere, the layer is held at a temperature of 450° C. for one hour, to thereby eliminate hydrogen in the amorphous silicon film. This is because a dangling bond is intentionally formed in the amorphous silicon film, to thereby lower a threshold value energy when crystallization is made later. Then, in the nitrogen atmosphere, a heat treatment is conducted at 600° C. for 4 to 8 hours, to thereby crystallize the amorphous silicon film. The reason why a temperature at the time of crystallization can be set to 600° C. is because of the action of nickel elements. During the above heat treatment, the crystallization of the silicon film is promoted while Ni elements are moving in the silicon film. In this way, a polycrystal silicon film 405 can be formed on the glass substrate at a temperature of 600° C. or lower. Further, in order to enhance the crystallinity, the polycrystal semiconductor film may be annealed by laser (FIG. 4B).

In the above method, nickel is coated on the entire surface of the semiconductor film. However, nickel may be selectively added to the semiconductor film using a mask or the like to make crystal grow. In this case, crystal mainly grows laterally.

Then, a process of removing nickel from the film is conducted. First, a mask 406 formed of an oxide film is formed in thickness of 1000 Å. This mask is arranged in order to selectively conduct doping with phosphorus. In this state, the film is doped with phosphorus with the result that only a portion 407 of the polycrystal silicon film which is not covered with the mask is doped with phosphorus. In this state, an acceleration voltage of doping and the thickness of the mask formed of the oxide film are optimized so that phosphorus is substantially prevented from going through the mask 406. The mask may not always be formed of the oxide film, but the oxide film is convenient because the oxide film does not cause contamination even if it is in direct contact with an active layer.

The dose of phosphorus is preferably about $1 \times 10^{14}$ to $1 \times 10^{15}$ ions/cm$^2$. In this embodiment, the dose of $5 \times 10^{14}$ ions/cm$^2$ is introduced into the outside of the device region by use of an ion doping device.

The acceleration voltage at the time of conducting ion doping is set to 10 kV. If the acceleration voltage is 10 KV, phosphorus can hardly pass through the oxide film mask of 1000 Å. Thereafter, the mask is removed, and laser irradiation is conducted in order to activate phosphorus in the active layer film.

For laser irradiation, an excimer laser that can provide a large output is used. The excimer laser having a linearly processed beam is used to increase the processing rate. In particular, a laser beam 0.5 mm in width and 12 cm in length is formed by KrF excimer laser and a predetermined lens group, and the beam is scanned relatively on the substrate in the widthways direction of the linear beam, to thereby irradiate the laser on the entire surface of the substrate.

Even if another kind of excimer laser, for example, XeCl excimer laser is used, the same effect is obtained. Also, even if a laser beam which is not linearly processed is used, the same effect is obtained. The sheet resistance of phosphorus thus activated is about 2 KΩ/□.

Figure 1A:
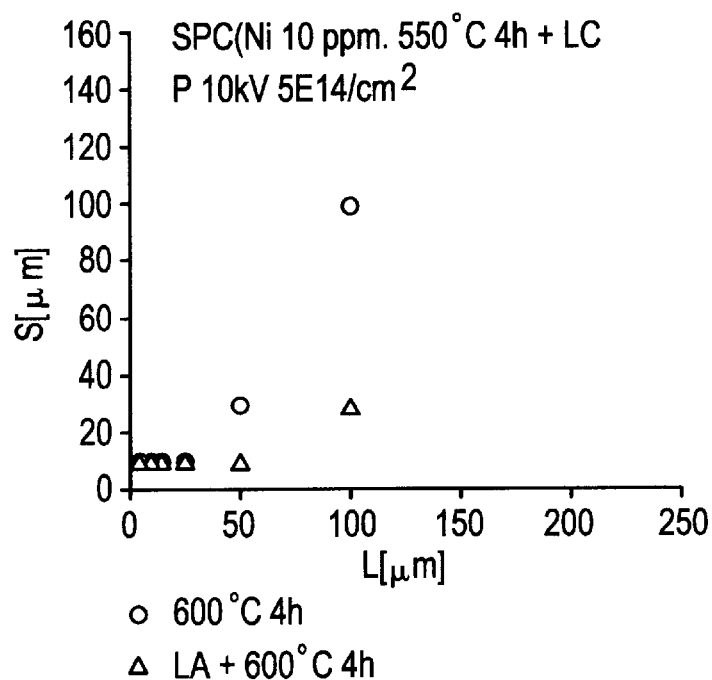
FIGS. 1A to 1C are graphs showing a difference in the effect between presence and absence of a laser process before thermal annealing in a gettering process, respectively.
Figure 1B:
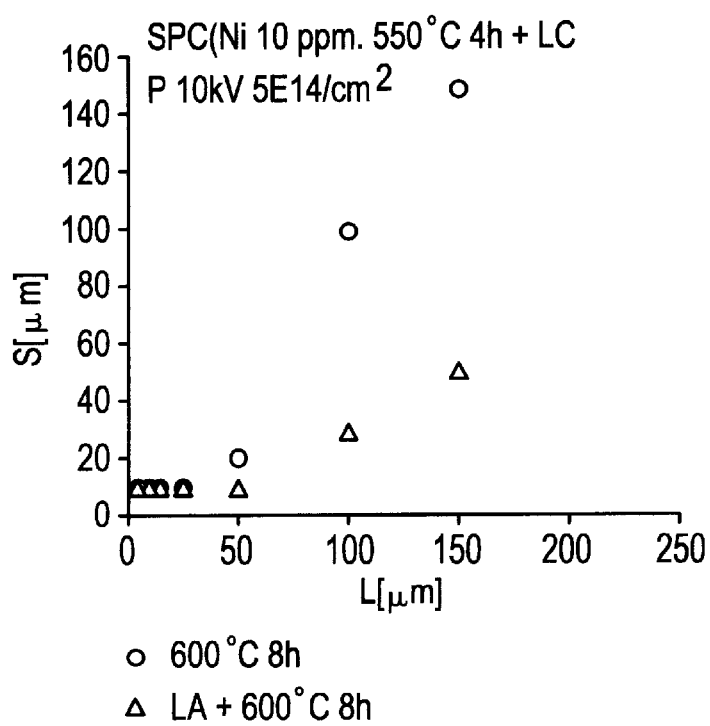
Figure 1C:
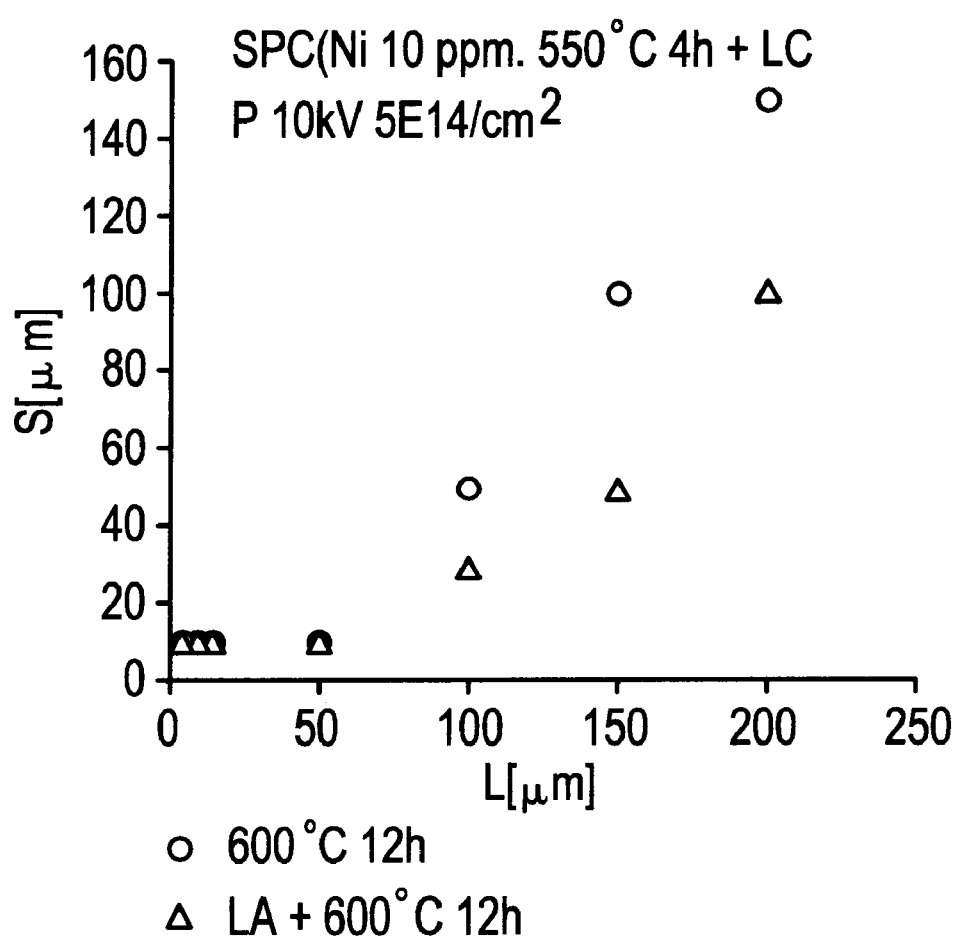

Thereafter, thermal annealing is conducted in the nitrogen atmosphere at 600° C. for 1 to 12 hours to getter nickel elements. Although phosphorus atoms hardly move in the film at a temperature of 600° C., nickel atoms can move about 100 μm or longer distance at that temperature. From this fact, it can be understood that phosphorus is one of elements most suitable for gettering nickel. The effect of the laser irradiation is shown in FIGS. 1A to 1C.

Subsequently, the polycrystal silicon film is patterned so that no region which is doped with phosphorus, that is, no region where nickel is gettered remains. In this way, a polycrystal silicon film 408 hardly containing nickel elements therein is obtained. The pattern of the silicon film thus obtained comes to the active layer of the TFT later.

Figure 3A:
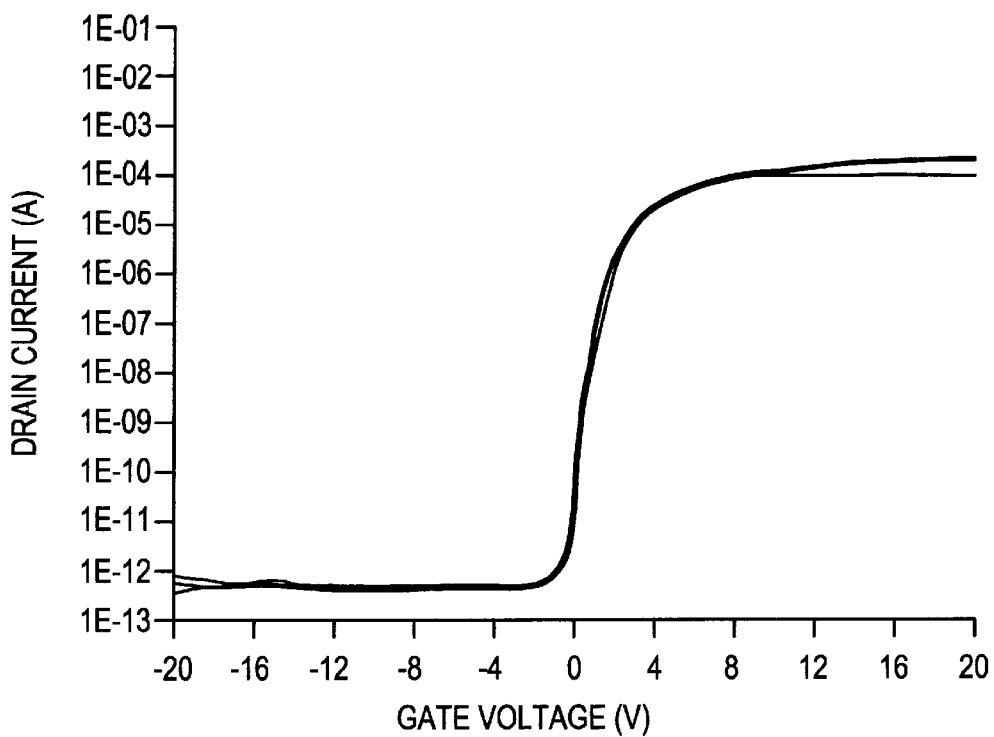
FIGS. 3A and 3B are graphs showing a difference in device characteristic between presence and absence of gettering, respectively.
Figure 3B:
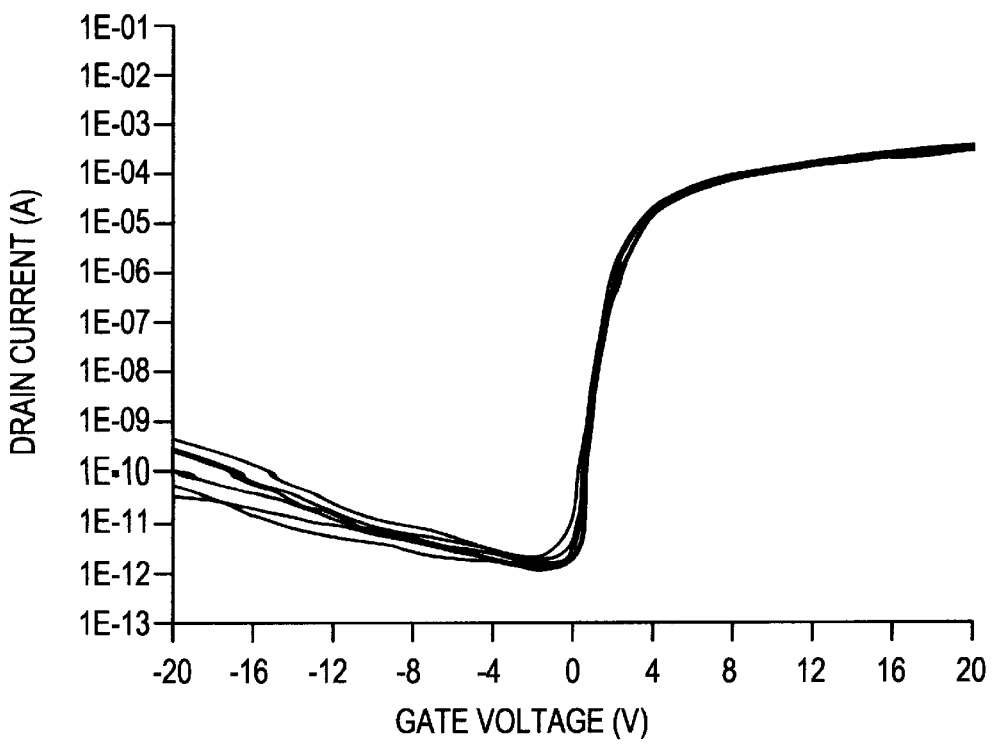
Figure 5A:
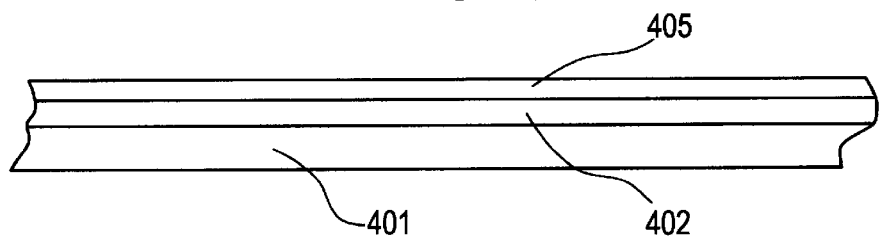
FIGS. 5A to 5E are diagrams showing a process of manufacturing a thin-film transistor.
Figure 5B:
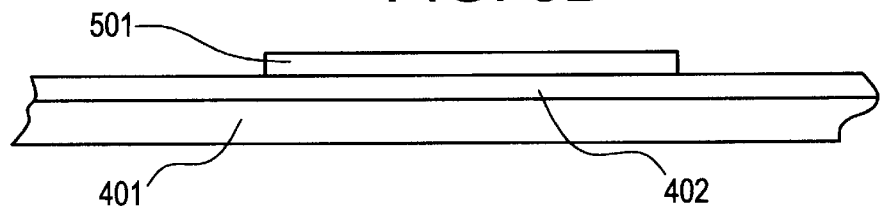
Figure 5C:
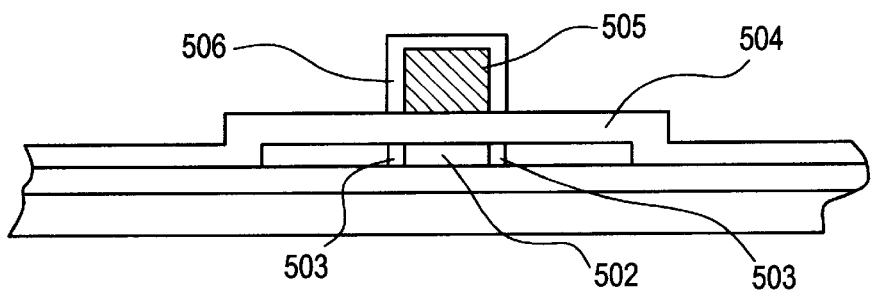
Figure 5D:
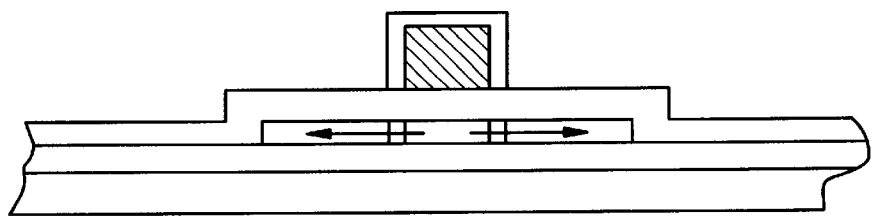
Figure 5E:
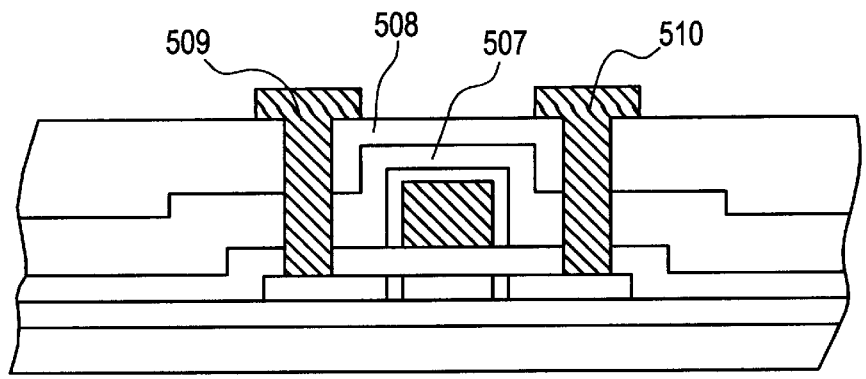

As a result of producing a TFT structured as shown in a third embodiment (refer to FIG. 5E) using the active layer formed in this embodiment, the TFT exhibiting the characteristic shown in FIG. 3A is obtained. On the other hand, the characteristic of a TFT having the same structure but from which the gettering process is omitted is shown in FIG. 3B. Compared with both TFTs, it is understood that the characteristic of the TFT which has been subjected to gettering is clearly excellent. In particular, the characteristic of an off-state current is remarkably improved.

Second Embodiment

This embodiment is directed to a manufacturing method of a semiconductor device in which the laser irradiating process that improves the capacity of gettering as described in the first embodiment is replaced by RTA.

RTA is an abridgment of "rapid thermal annealing". In RTA, what mainly emits infrared rays as represented by halogen lamp is used as a light source, and only a film stuck on the surface of a substrate can be heated for a short period of time.

However, the substrate is also slightly heated because the heating period cannot be shortened more than that of laser, a wavelength region is mainly in an infrared ray region (an excimer layer beam is a ultraviolet ray), and so on.

Accordingly, compared with laser, it is difficult for RTA to give a high energy to a film, but since the energy is stable more than the laser energy, annealing can be more uniformly conducted. Also, RTA provides the capacity that satisfactorily gives an energy required in this embodiment to the active layer.

The RTA used in this embodiment has a halogen lamp. The RTA used in this embodiment has a beam-like ray which has been linearly processed, and enhances the processing efficiency. The processing method is substantially identical with a method using the linear laser. However, since a long processing period is required unlike laser, there is a case in which the substrate is cracked because it does not withstand a rapid change in temperature. Therefore, there is required that the substrate temperature is raised before the processing.

In this embodiment, the temperature of the substrate is heated up to 350° C. in advance, and thereafter a halogen lamp is irradiated on the substrate in a scanning manner in the same manner as the laser irradiation.

Even if the halogen lamp is replaced by an arc lamp, the same effect is obtained. Also, there is not always required that the RTA rays are processed linearly. The sheet resistance of a film obtained by replacing only the laser irradiating process by the RTA process in the manufacturing method of the first embodiment is 5 k$\Omega$/□. The remaining processes are the same as those of the first embodiment. The product manufactured in the method of this embodiment provides the characteristic substantially equivalent to that obtained in the first embodiment.

Third Embodiment

In this embodiment, after crystallization promoting catalytic elements are added to a non-crystalline semiconductor film, and a desired crystallinity is given to the crystalline film by means such as annealing, needless crystallization promoting catalytic elements are concentrated on a portion where the device characteristic is hardly adversely affected by the crystallization promoting catalytic elements.

In this embodiment, a TFT is manufactured using the polycrystal silicon film 405 which is advanced to a process before nickel is removed in the manufacturing process of the first embodiment. Nickel is distributed in the polycrystal silicon film with a relatively high concentration ($10^{18}$ ATOMS/cm$^3$ or higher).

In FIGS. 5A to 5E, the polycrystal silicon film 405 is patterned so as to form an active layer pattern 501 of the TFT. In the active layer pattern 501 are formed a channel formation region 502 and a high-resistant region 503. After the formation of the active layer, a silicon oxide film is formed in thickness of 100 nm as a gate insulating film 504 through the plasma CVD method.

Then, a titanium film is formed in thickness of 400 nm through the sputtering method. Then, the titanium film is patterned to obtain a gate electrode 505. Further, an anodic oxide film 506 is formed in thickness of 200 nm on a surface from which the titanium film pattern is exposed through the anodic oxidizing method.

The anodic oxide film 506 has a function of electrically and physically protecting the surface of the gate electrode 505. Also, the anodic oxide film 506 functions to form the high-resistant region 503, which is called "offset region", so as to be adjacent to the channel region 502.

Then, using the gate electrode 505 and the anodic oxide film 506 formed on a periphery thereof as a mask, the layer is doped with phosphorus. The phosphorus plays both of the role of dopant in order to decide source and drain regions and the role of gettering the nickel elements.

The doping of phosphorus allows the source and drain regions to be formed in a self-aligning manner. As to the dose of phosphorus in this embodiment, the dose of $5\times10^{14}$ ions/cm$^2$ is introduced using an ion doping device.

Then, phosphorus is activated by laser with the result that the gettering capacity of phosphorus can be enhanced. Phosphorus getters not only nickel but also other impurities. The laser is irradiated by the method described in the first embodiment.

The energy density of a laser beam is set to about 200 mJ/cm$^2$. An appropriate energy density in this process needs to be adjusted according to the kind of laser, the irradiating method and the state of the semiconductor film. The irradiation of laser makes the sheet resistance of the source and drain regions lower to 1 K$\Omega$/□.

After the irradiation of laser, a heat treatment is conducted in order to remove nickel and other impurities from the channel region 502 and the high-resistant region 503. This heat treatment is conducted in a nitrogen atmosphere under the conditions where the temperature is 640° C., and the temperature maintaining period is 1 hour. Although phosphorus elements hardly move during this process, nickel is attracted to phosphorus so that it largely moves in the film. As a result, nickel elements are concentrated in the source and drain regions. Those nickel elements exist in a bond state such as NiP, NiP2, Ni2P, . . . in the active layer. It is found that the bond state is very stable, and also the operation of the TFT is hardly adversely affected by nickel so far as Ni is in the source and drain regions.

Subsequently, a silicon nitride film 507 is formed in thickness of 150 nm as an interlayer insulating film through the plasma CVD method, and also an acrylic resin film 508 is formed thereon. The thickness of the acrylic resin film 508 is set to 700 nm at the thinnest portion. The reason why a resin film is used is because the surface is flattened.

A material of polyimide, polyamide, polyimidamide, epoxy or the like can be used other than acrylic. This resin film may be of a multi-layer film.

Then, the formation of contact holes are made to form a source electrode 509 and a drain electrode 510. In this way, an N channel TFT is completed. No nickel element substantially exists in the channel region and the high-resistant region of the TFT according to this embodiment (the concentration of nickel elements is $5\times10^{16}$ ATOMS/cm$^3$ or less).

Also, nickel elements substantially exist in the source and drain regions. In this embodiment, since phosphorus is introduced into the source and drain regions, the N channel TFT is produced. However, if a P channel TFT is intended to be manufactured, the layer may be doped with boron in addition to phosphorus.

It is understood that if impurities substantially exist in the channel region and the high-resistant region adjacent to the channel region, the operation of the TFT is largely adversely affected by the impurities. In particular, this leads to various problems such as the characteristic failure, the characteristic variation and the lowering of reliability. This embodiment is to solve the above problem. In particular, the characteristic of the off-state current is remarkably improved.

Fourth Embodiment

Figure 2A:
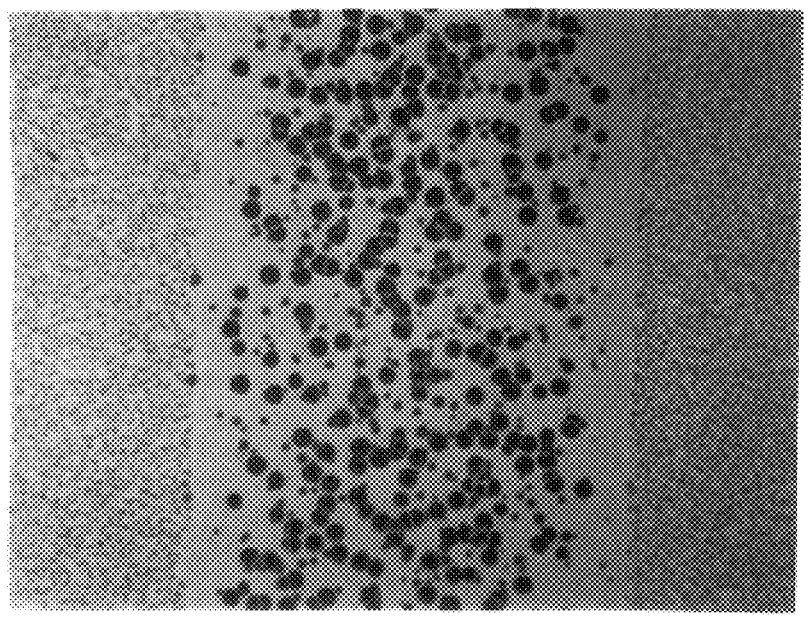
FIGS. 2A and 2B are photographs showing a surface of a silicon film which has been subjected to gettering, respectively.
Figure 2B:
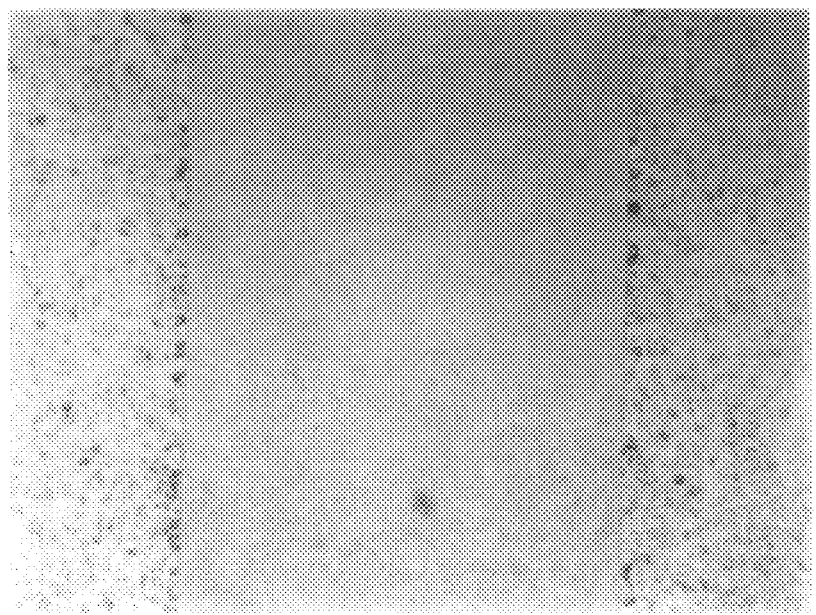

This embodiment is directed to a manufacturing method of a semiconductor device in which a laser irradiating process that improves the capacity of gettering as described in the third embodiment is replaced by RTA. RTA provides the capacity that satisfactorily gives an energy required in this embodiment to an active layer. The RTA used in this embodiment is the same as that shown in FIG. 2.

Only the laser irradiating process is replaced by the RTA process in the manufacturing method shown in the third embodiment, and a sheet resistance of the film thus obtained is 5 KΩ/□. The remaining process is conducted in the same manner as that in the third embodiment. The product manufactured in the method of this embodiment provides the characteristic substantially equivalent to that obtained in the third embodiment.

Fifth Embodiment

This embodiment is directed to an example in which a reverse-stagger N channel TFT is manufactured. FIGS. 6A to 6D show a process of manufacturing the thin-film transistor according to this embodiment. First, a gate electrode pattern 602 is formed on a glass substrate 601.

The gate electrode 602 is obtained by forming a titanium film and then patterning that film. Subsequently, a silicon oxide film is formed as a gate insulating film 603 through the plasma CVD method. Further, an amorphous silicon film 604 is formed thereon through the low-pressure CVD (LPCVD) method.

Thereafter, the irradiation of a UV light allows a thin oxide film to be formed on the surface of the amorphous silicon film. Moreover, a liquid-phase Ni acetic acid is coated on the surface of the amorphous silicon film through the spin coating method. The oxide film is formed in order to uniformly coat Ni acetic acid 605 on the film surface. Ni elements function as elements that promote the crystallization when the amorphous silicon film is crystallized.

Subsequently, in a nitrogen atmosphere, the layer is held at a temperature of 450° C. for one hour, to thereby eliminate hydrogen in the amorphous silicon film. This is because a dangling bond is intentionally formed in the amorphous silicon film, to thereby lower a threshold value energy when crystallization is made later.

Then, in the nitrogen atmosphere, a heat treatment is conducted at 600° C. for 4 to 8 hours, to thereby crystallize the amorphous silicon film 604. The reason why the temperature at the time of crystallization can be set to 600° C. is because of the action of nickel elements.

During the above heat treatment, moving in the silicon film, Ni elements promote the crystallization of the silicon film. In this way, a polycrystal silicon film can be formed on the glass substrate at a temperature of 600° C. or lower.

Figure 6A:
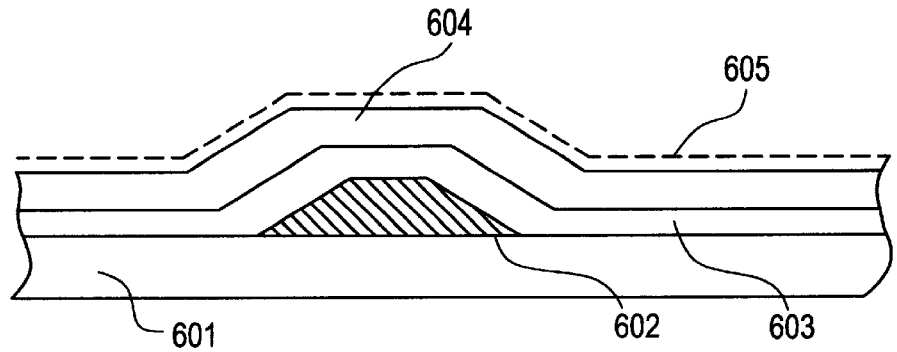
FIGS. 6A to 6D are diagrams showing a process of manufacturing the thin-film transistor.
Figure 6B:
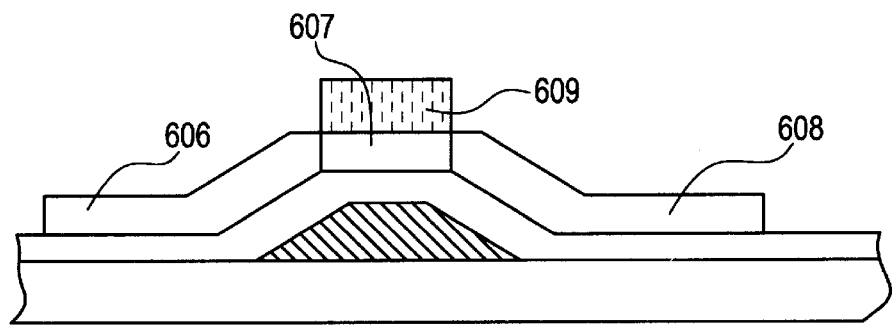
Figure 6C:
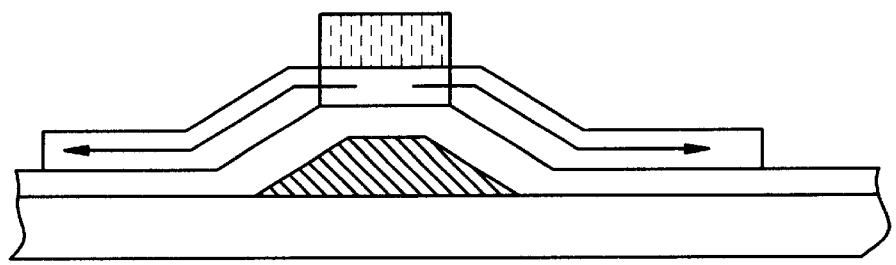
Figure 6D:
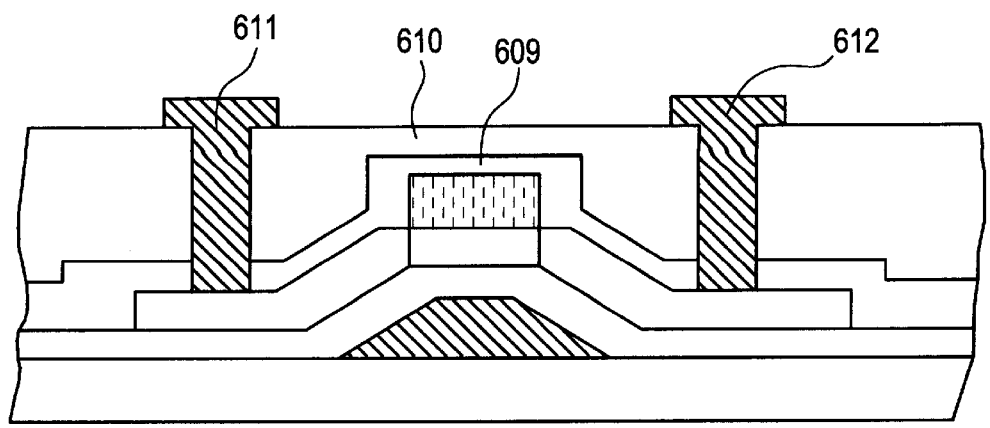

Next, as shown in FIG. 6B, a mask 609 formed of a silicon oxide film is formed. In this embodiment, a silicon oxide film pattern shown in FIG. 6B is formed through an exposure technique from the back surface side of the substrate.

Then, the layer is doped with phosphorus through the ion doping method (or ion implantation method) so as to implant phosphorus into a region other than the region on which the oxide film is formed. In this situation, a portion which is not doped with ions comes to a channel region 607. Other regions which are doped with phosphorus come to source and drain regions 606 and 608.

In this state, laser is irradiated onto the layer to activate the source and drain regions. Alternatively, the source and drain regions are activated by RTA. The irradiating method is as described in the former first and second embodiments. The sheet resistance of the source and drain regions 606 and 608 in this situation is, when laser is irradiated thereon, 5 KΩ/□ or less, and in this embodiment, 2 KΩ/□, and when RTA processing is made, 10 KΩ/□ or less, and in this embodiment, 5 KΩ/□. Preferably, it is 3 KΩ/□ or less.

Then, nickel elements are attracted to phosphorus by conducting a heat treatment in the nitrogen atmosphere at 620° C. for one hour. Since phosphorus hardly moves under the environment of 620° C., this processing enables a region in which phosphorus and nickel substantially do not exist (channel region 607) and a region in which phosphorus and nickel exist together (source and drain regions 606 and 608) to be selectively formed in the silicon film (refer to FIG. 6C).

Phosphorus functions as dopant of the N channel TFT as it is. It is found that in this process, although nickel remains in the source and drain regions 606 and 608, the characteristic of the device is hardly adversely affected by the remaining nickel. That nickel is segregated in the source and drain regions to lower the resistance of the region is convenient.

Thereafter, interlayer insulating films 609 and 610 are formed, and contact holes are then formed to form a source electrode 611 and a drain electrode 612. In this way, a bottom gate type TFT is completed. In this embodiment, since phosphorus is introduced into the source and drain regions, the N channel TFT is manufactured. If a P channel TFT is intended to be manufactured, it is doped with boron in addition to phosphorus.

Sixth Embodiment

Figure 7A:
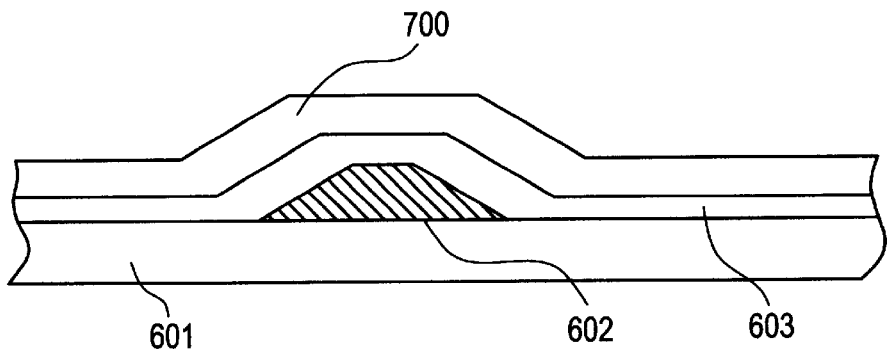
FIGS. 7A to 7D are diagrams showing a process of manufacturing a crystalline silicon film.

This embodiment is directed to an example in which a reverse stagger type TFT is manufactured. FIGS. 7A to 7D show a part of the manufacturing process according to this embodiment. The processes until a process of forming a polycrystal silicon film 700 on a glass substrate are identical with the processes of the fifth embodiment (FIG. 7A).

First, as shown in FIGS. 7A to 7D, a mask 701 formed of a silicon oxide film is formed. The mask in this embodiment is formed so as to cover the entire surface of the device region.

Then, doping with phosphorus is conducted using the ion doping method (or ion implantation method), and phosphorus is implanted in a region other than the region on which the oxide film is formed. In this situation, a portion which is not doped with ions is mainly used as the device. Another region 702 which is doped with phosphorus is removed in a latter process.

Figure 7B:
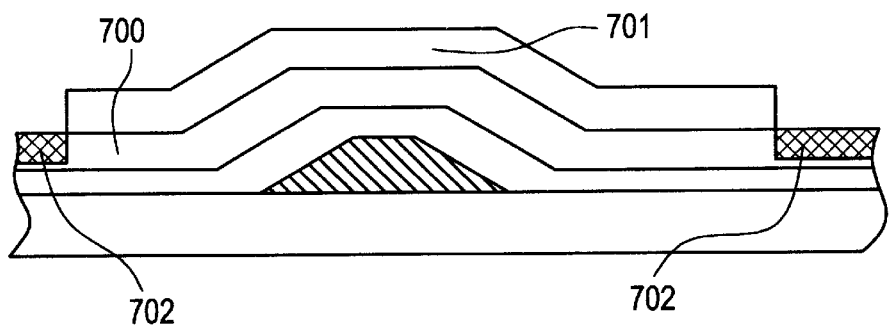
Figure 7C:
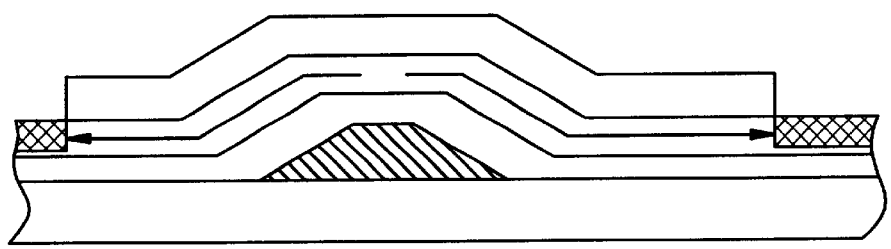

In this state, laser is irradiated to activate phosphorus in the polycrystal silicon film. Alternatively, phosphorus is activated by RTA. The irradiating method is as described in the above embodiments 1 and 2. The sheet resistance of the activated region at this time is when laser is irradiated thereon, 2 KΩ/□, and when RTA processing is made, 5 KΩ/□ (FIG. 7B).

Then, nickel elements are attracted to phosphorus by conducting a heat treatment in the nitrogen atmosphere at 600° C. for four hours. Since phosphorus hardly moves under the environment of 600° C., this processing enables a region in which phosphorus and nickel substantially do not exist and a region in which phosphorus and nickel exist together to be selectively formed in the silicon film (refer to FIG. 7C).

Then, the exposed silicon film is removed using the mask. With this process, nickel is almost removed from the film so that no nickel substantially exists. Further, the mask is removed to arrange a new mask again, and the remaining silicon film is patterned. The pattern of this silicon film comes to the active layer of the TFT later. No nickel substantially exists in the active layer.

Figure 7D:
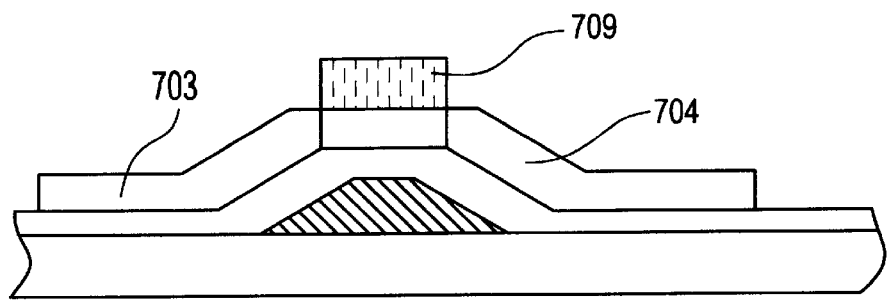

Thereafter, as shown in FIG. 7D, a mask 709 formed of a silicon oxide film is formed. In this example, the mask is formed using an exposure technique from the back surface side of the substrate. Using this as a mask, dopant is implanted into portions that will form the source region 703 and the drain region 704. This structure is identical with that shown in FIG. 6B. Thereafter, the TFT is manufactured using the method shown in FIG. 6.

That is, thereafter an interlayer insulating film is formed, contact holes are further formed to form a source electrode and a drain electrode. In this way, a bottom gate type TFT is completed.

Seventh Embodiment

Figure 8:
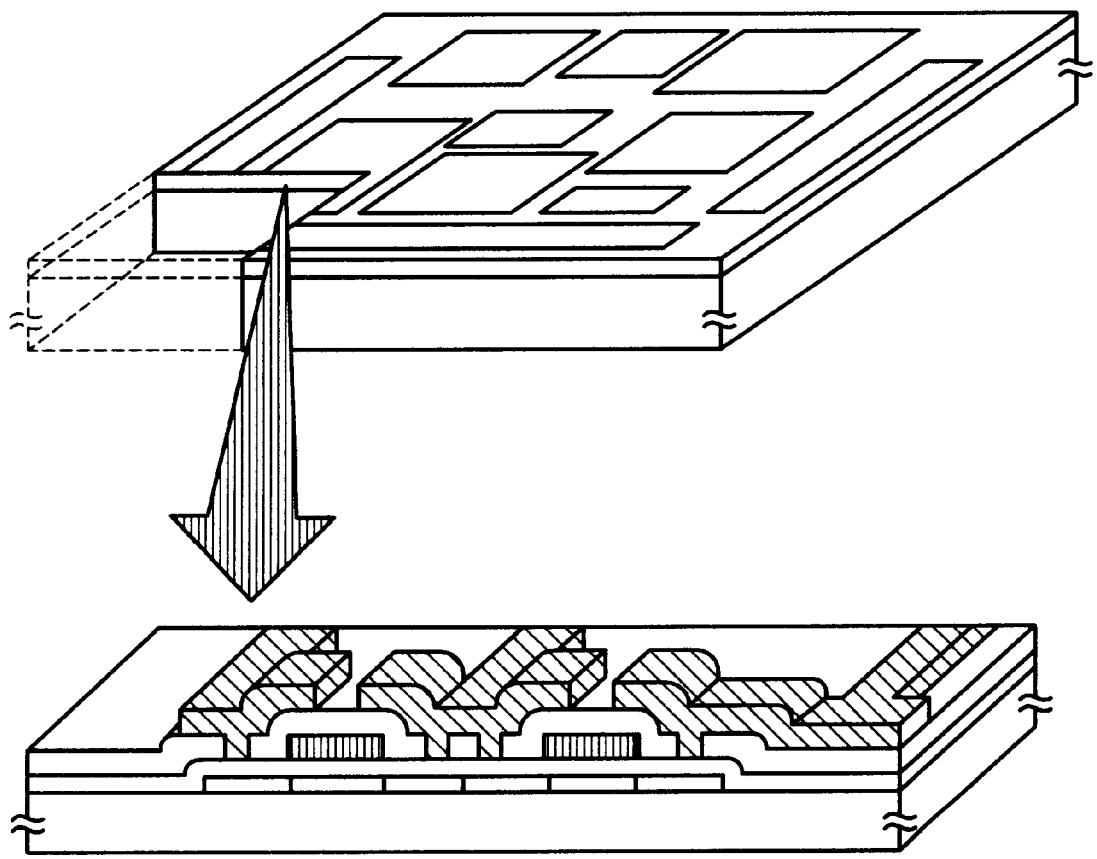
FIG. 8 is a diagram showing an integrated circuit using a TFT.

This embodiment shows an example in which an integrated circuit is structured by a TFT. The integrated circuit may be a CPU circuit, a memory circuit and so on. FIG. 8 shows the outline of the integrated circuit using the TFT.

Eighth Embodiment

This embodiment is directed to an example of a semiconductor device using a TFT obtained by the manufacturing method described in this specification.

What is shown in FIG. 9A is a portable information processing terminal. This information processing terminal includes active matrix liquid crystal display or active matrix EL display 2005 in a main body 2001, and also includes a camera section 2002 for taking in information from the exterior.

In the camera section 2002 are disposed an image receiver 2003 and an operating switch 2004.

It is expected that the information processing terminal will be more thinned and lightened in order to more improve the portability in the future.

In this structure, it is preferable that a peripheral drive circuit, an operating circuit or a memory circuit on a substrate on which the active matrix display 2005 is formed is integrated by TFTs. Reference numeral 2006 denotes an integrated circuit.

What is shown in FIG. 9B is a head mount display. This device includes an active matrix liquid crystal display or EL display 2102 in a main body 2101. Also, the main body 2101 is designed so as to be put on a head by means of a band 2103.

What is shown in FIG. 9C is a car navigation device. This device includes a liquid crystal display device 2202 and an operating switch 2203 in a main body 2201, and has a function of displaying geographic information, etc., according to a signal received by an antenna 2204.

What is shown in FIG. 9D is a portable telephone. This device includes an active matrix liquid crystal display device 2304, an operating switch 2305, an audio input section 2303, an audio output section 2302 and an antenna 2306 in a main body 2301.

Also, in recent years, the structure in which the portable information processing terminal shown in FIG. 9A and the portable telephone shown in FIG. 9D is combined is also commercialized. Even in this structure, an arrangement in which the active matrix display and other circuits are integrated on the same substrate by TFTs is useful.

What is shown in FIG. 9E is a portable video camera. This provides an image receiver 2406, an audio input section 2403, an operating switch 2404, an active matrix liquid crystal display 2402 and a battery 2405 in a main body 2401.

What is shown in FIG. 9F is a projection type liquid crystal display device. This structure includes a light source 2502, an active matrix liquid crystal display device 2503 and an optical system 2504 in a main body 2501, and has a function of displaying an image on a screen 2505 disposed outside of the device.

In this example, the liquid crystal display device may be of the transmission type or the reflection type.

Also, in the devices shown in FIGS. 9A to 9E, an active matrix display using an EL element may be used instead of a liquid crystal display device.

The TFT used in the present invention can restrain a variation of the characteristic when manufacturing a large number of TFTs, and therefore it is suitable for the structure that requires the TFT circuit as described in this embodiment.

The technique of crystallizing the semiconductor material according to the present invention enable the semiconductor material excellent in crystallinity and low in the contents of impurities such as heavy metal to be manufactured. The semiconductor material of the present invention can be employed as a base of all of the semiconductor devices, and in particular when a TFT liquid crystal panel is applied as the semiconductor device, the high-speed operation of the peripheral drive circuit is enabled to reduce a variation of the characteristic between the devices. This advantages are to make the movement of a screen in the TFT liquid crystal display device high and to reduce the ratio of occurrence of the defective substrate having a point defect, a linear defect or the like. Thus, the present invention is believed to be useful in the industrial field.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device, comprising the steps of:

forming an amorphous semiconductor film containing silicon therein on a substrate having an insulating surface;

introducing at least one catalytic element that promotes crystallization of said amorphous semiconductor film into said amorphous semiconductor film;

crystallizing said amorphous semiconductor film through a heat treatment;

selectively introducing at least one gettering element that enables said catalytic element to be gettered into a crystallized semiconductor film;

activating said gettering element by irradiating said semiconductor film with a light; and gettering said catalytic element through a heat treatment in a region into which the gettering element is introduced, wherein said crystallizing and gettering steps are conducted so that a temperature of said substrate does not exceed a strain point temperature of said substrate.

2. A method according to claim 1, wherein said light is an excimer layer beam or an infrared ray.

3. A method according to claim 1, wherein the catalytic element that promotes the crystallization is one or plural kinds of elements selected from Ni, Fe, Co, Ru, Rh, Pd, Os, Ir, Pt, Cu and Au.

4. A method according to claim 1, wherein the catalytic element that promotes the crystallization is one or plural kinds of elements selected from Ge, Pb and In.

5. A method according to claim 1, wherein the gettering element is P or the mixture of P with one or plural kinds of elements selected from B, As and Sb.

6. A method according to claim 1, wherein the gettering element is one or plural kinds of elements selected from P, N, As, Sb and Bi.

7. A method according to claim 1, wherein said gettering element is introduced into said semiconductor film except for a region in which a semiconductor island is formed.

8. A method according to claim 1, wherein said gettering element is introduced into said semiconductor film except for both of a channel region and a high-resistant region.

9. A method according to claim 1, wherein the catalytic element is one or plural kinds of elements selected from Ni, Fe, Co, Ru, Rh, Pd, Os, Ir, Pt, Cu and Au.

10. A method of manufacturing a semiconductor device, comprising:

forming an amorphous semiconductor film containing silicon therein on a substrate having an insulating surface;

introducing nickel which is a catalytic element that promotes crystallization of said amorphous semiconductor film into said amorphous semiconductor film;

crystallizing said amorphous semiconductor film through a heat treatment;

selectively introducing phosphorus which is an element that enables said catalytic element to be gettered into a crystallized semiconductor film;

activating introduced phosphorus which is said gettering element by irradiating said semiconductor film with a light; and gettering nickel which is said catalytic element through a heat treatment in a region into which phosphorus which is the gettering element is introduced, wherein said crystallizing and gettering steps are conducted so that a temperature of said substrate does not exceed a strain point temperature of said substrate.

11. A method according to claim 10, wherein said light is an excimer layer beam or an infrared ray.

12. A method according to claim 10, wherein said light is an intense light.

13. A method according to claim 10, wherein a sheet resistance of a region in which phosphorus is activated is 10 K$\Omega$/[]_or less.

14. A method according to claim 10, wherein a sheet resistance of a region in which phosphorus is activated is 3 K$\Omega$/[]_ or less.

15. A method according to claim 10, wherein a ratio of an area of the region in which phosphorus is introduced to an area of a region in which nickel is gettered is in a range of from 0.05:1 to 0.6:1 .

16. A method according to claim 10, wherein a ratio of an area of the region in which phosphorus is introduced to an area of a region in which nickel is gettered is in a range of from 0.1:1 to 0.5:1.

17. A method according to claim 10, wherein an amount of introduced phosphorus is in a range of from $1\times10^{13}$ to $1\times10^{16}$ IONS/cm$^2$.

18. A method according to claim 10, wherein an amount of introduced phosphorus is in a range of from $1\times10^{14}$ to $3\times10^{15}$ IONS/cm$^2$.

19. A method according to claim 10, wherein heat treatment temperatures in said crystallizing and gettering steps are 400 to 950° C. respectively.

20. A method according to claim 10, wherein heat treatment temperatures in said crystallizing and gettering steps are 500 to 850° C. respectively.

21. A method according to claim 10, wherein a period of said heat treatment in said gettering step is 1 minute to 20 hours.

22. A method according to claim 10, wherein a period of said heat treatment in said gettering is 30 minutes to 3 hours.

23. A method according to claim 10, wherein said gettering element is introduced into said semiconductor film except for a region in which a semiconductor island is formed.

24. A method according to claim 10, wherein said gettering element is introduced into said semiconductor film except for both of a channel region and a high-resistant region.

25. A method according to claim 10, wherein a total number of phosphorus atoms introduced into said semiconductor film is more than a total number of nickel atoms introduced into said semiconductor film.

26. A method according to claim 10, wherein a total number of phosphorus atoms introduced into said semiconductor film is three times or more as many as a total number of nickel atoms introduced into the semiconductor film.

27. A method according to claim 10, wherein a ratio of an area of the region in which said gettering element is introduced to an area of a region in which said catalyst element is gettered is in a range of from 0.05:1 to 0.6:1.

28. A method of manufacturing a semiconductor device, comprising the steps of:

forming a gate electrode over a substrate having an insulating surface:

forming an amorphous semiconductor film comprising silicon over said gate electrode with a gate insulating film interposed therebetween;

introducing a catalytic element that promotes crystallization of silicon into said amorphous semiconductor film;

heating said semiconductor film for crystallizing said amorphous semiconductor film;

selectively introducing a gettering element into a crystallized semiconductor film;

irradiating said semiconductor film with a light for activating said gettering element; and heating said semiconductor film for gettering said catalytic element into a region into which the gettering element is introduced, wherein said light is an excimer layer beam or an infrared ray.

29. A method according to claim 28, wherein the catalytic element is one or plural kinds of elements selected from Ni, Fe, Co, Ru, Rh, Pd, Os, Ir, Pt, Cu and Au.

30. A method according to claim 28, wherein the catalytic element is one or plural kinds of elements selected from Ge, Pb and In.

31. A method according to claim 28, wherein the gettering element is P or the mixture of P with one or plural kinds of elements selected from B, As and Sb.

32. A method according to claim 28, wherein the gettering element is one or plural kinds of elements selected from P, N, As, Sb and Bi.

33. A method according to claim 28, wherein a ratio of an area of the region in which said gettering element is introduced to an area of a region in which said catalyst element is gettered is in a range of from 0.05:1 to 0.6:1.

34. A method according to claim 28, wherein a dose of said gettering element in said introducing step is in a range of from $1\times10^{13}$ to $1\times10^{16}$ IONS/cm$^2$.

35. A method according to claim 28, wherein temperatures in said heating steps for crystallizing and gettering are 400 to 950° C., respectively.

36. A method of manufacturing a semiconductor device, comprising the steps of:

forming an amorphous semiconductor film comprising silicon over a substrate having an insulating surface;

introducing catalytic element that promotes crystallization of silicon into said amorphous semiconductor film;

heating said semiconductor film for crystallizing said amorphous semiconductor film;

selectively introducing a gettering element into a crystallized semiconductor film;

irradiating said semiconductor film with a light for activating said gettering element;

heating said semiconductor film for gettering said catalytic element into a region into which the gettering element is introduced; and patterning said semiconductor film for forming a semiconductor island excluding said region into which the gettering element is introduced.

wherein said light is an excimer layer beam or an infrared ray.

37. A method according to claim 36, wherein the catalytic element is one or plural kinds of elements selected from Ge, Pb and In.

38. A method according to claim 36, wherein the gettering element is P or the mixture of P with one or plural kinds of elements selected from B, As and Sb.

39. A method according to claim 36, wherein the gettering element is one or plural kinds of elements selected from P, N, As, Sb and Bi.

40. A method according to claim 36, wherein a ratio of an area of the region in which said gettering element is introduced to an area of a region in which said catalyst element is gettered is in a range of from 0.05:1 to 0.6:1.

41. A method according to claim 36, wherein a dose of said gettering element in said introducing step is in a range of from $1\times10^{13}$ to $1\times10^{16}$ IONS/cm$^2$.

42. A method according to claim 36, wherein temperatures in said heating steps for crystallizing and gettering are 400 to 950° C., respectively.

43. A method of manufacturing a semiconductor device, comprising the steps of:

forming an amorphous semiconductor film comprising silicon over a substrate having an insulating surface;

introducing catalytic element that promotes crystallization of silicon into said amorphous semiconductor film;

heating said semiconductor film for crystallizing said amorphous semiconductor film;

patterning said semiconductor film for forming a semiconductor island;

selectively introducing a gettering element into said semiconductor island;

irradiating said semiconductor island with a light for activating said gettering element; and heating said semiconductor island for gettering said catalytic element into a region into which the gettering element is introduced, wherein said light is an excimer layer beam or an infrared ray.

44. A method according to claim 43, wherein the catalytic element is one or plural kinds of elements selected from Ni, Fe, Co, Ru, Rh, Pd, Os, Ir, Pt, Cu and Au.

45. A method according to claim 43, wherein the catalytic element is one or plural kinds of elements selected from Ge, Pb and In.

46. A method according to claim 43, wherein the gettering element is P or the mixture of P with one or plural kinds of elements selected from B, As and Sb.

47. A method according to claim 43, wherein the gettering element is one or plural kinds of elements selected from P, N, As, Sb and Bi.

48. A method according to claim 43, wherein a dose of said gettering element in said introducing step is in a range of from $1\times10^{13}$ to $1\times10^{16}$ IONS/cm$^2$.

49. A method according to claim 43, wherein temperatures in said heating steps for crystallizing and gettering are 400 to 950° C., respectively.

* * * * *